US012744083B2

(12) United States Patent
di Vincenzo et al.

(10) Patent No.: US 12,744,083 B2
(45) Date of Patent: Sep. 22, 2026

(54) DIFFERENTIAL SUBTHRESHOLD READ OF MEMORY CELL PAIR IN A MEMORY DEVICE

(71) Applicant: Micron Technology, Inc., Boise, ID (US)

(72) Inventors: Umberto di Vincenzo, Capriate San Gervasio (IT); Michele Maria Venturini, Milan (IT)

(73) Assignee: Micron Technology, Inc., Boise, ID (US)

(*) Notice: Subject to any disclaimer, the term of this patent is extended or adjusted under 35 U.S.C. 154(b) by 711 days.

(21) Appl. No.: 17/748,666

(22) Filed: May 19, 2022

(65) Prior Publication Data

US 2023/0377646 A1 Nov. 23, 2023

(51) Int. Cl.
*G11C 13/00* (2006.01)
*H03K 19/20* (2006.01)
*H10N 70/00* (2023.01)

(52) U.S. Cl.
CPC ........ *G11C 13/004* (2013.01); *G11C 13/0004* (2013.01); *G11C 13/0028* (2013.01); *G11C 2013/0042* (2013.01); *G11C 2213/71* (2013.01); *H03K 19/20* (2013.01); *H10N 70/826* (2023.02)

(58) Field of Classification Search
CPC .............................. G11C 5/145; H03L 7/0814
See application file for complete search history.

(56) References Cited

U.S. PATENT DOCUMENTS 10,943,654 B2 3/2021 Bedeschi et al.
10,998,028 B2 5/2021 Di Vincenzo et al.
11,289,147 B2 3/2022 Di Vincenzo et al.
2017/0288683 A1* 10/2017 Wei ........................ H03L 7/0814
2022/0130447 A1 4/2022 Mccrate et al.
2022/0172789 A1* 6/2022 Piccardi ................. G11C 5/145

* cited by examiner

*Primary Examiner* — Jason Lappas
(74) *Attorney, Agent, or Firm* — Greenberg Traurig

(57) ABSTRACT

Systems, methods, and apparatus related to memory devices. In one approach, a differential read operation is performed on a memory cell pair. Bitlines or digit lines are used to select the memory cells. The read operation is performed in a subthreshold mode in which the memory cells of the pair do not threshold (e.g., do not switch or snap). A voltage on a wordline used to select the memory cell pair is ramped to increasing magnitudes of voltage while the bitline or digit line voltages are held fixed. One or more detectors are used to determine a difference in leakage currents of the two memory cells. A logic state is determined (e.g., using at least one detector) based on the difference in leakage currents. A feedback circuit reduces voltages applied to the bitlines or digit lines in order to avoid thresholding the cells. The voltage reduction by the feedback circuit is triggered when the reading of the memory cell pair is complete.

20 Claims, 9 Drawing Sheets

DIFFERENTIAL SUBTHRESHOLD READ OF MEMORY CELL PAIR IN A MEMORY DEVICE

FIELD OF THE TECHNOLOGY

At least some embodiments disclosed herein relate to memory systems in general, and more particularly, but not limited to differential subthreshold reading of a memory cell pair in a memory device.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

A storage device is an example of a memory device. Typical computer storage devices have controllers that receive data access requests from host computers and perform programmed computing tasks to implement the requests in ways that may be specific to the media and structure configured in the storage devices. In one example, a memory controller manages data stored in memory and communicates with a computer device. In some examples, memory controllers are used in solid state drives for use in mobile devices or laptops, or media used in digital cameras.

Firmware can be used to operate a memory controller for a particular storage device. In one example, when a computer system or device reads data from or writes data to a memory device, it communicates with the memory controller.

Memory devices typically store data in memory cells. In some cases, memory cells exhibit non-uniform, variable electrical characteristics that may originate from various factors including statistical process variations, cycling events (e.g., read or write operations on the memory cells), or a drift (e.g., a change in resistance of a chalcogenide alloy), among others.

In one example, reading a set of data (e.g., a codeword, or a page) is carried out by determining a read voltage (e.g., an estimated median of threshold voltages) of memory cells that store the set of data. In some cases, a memory device may include an array of PCM cells arranged in a 3D architecture, such as a cross-point architecture to store the set of data. PCM cells in a cross-point architecture may represent a first logic state (e.g., a logic 1, a SET state) associated with a first set of threshold voltages, or a second logic state (e.g., a logic 0, a RESET state) associated with a second set of threshold voltages. In some cases, data may be stored using encoding (e.g., error correction coding (ECC)) to recover data from errors in the data stored in the memory cells.

For resistance variable memory cells (e.g., PCM cells), one of a number of states (e.g., resistance states) can be set. For example, a single level cell (SLC) may be programmed to one of two states (e.g., logic 1 or 0), which can depend on whether the cell is programmed to a resistance above or below a particular level. As an additional example, various resistance variable memory cells can be programmed to one of multiple different states corresponding to multiple data states, e.g., 10, 01, 00, 11, 111, 101, 100, 1010, 1111, 0101, 0001, etc. Such cells may be referred to as multi state cells, multi-digit cells, and/or multi-level cells (MLCs).

The state of a resistance variable memory cell can be determined (e.g., read) by sensing current through the cell responsive to an applied interrogation voltage. The sensed current, which varies based on the resistance of the cell, can indicate the state of the cell (e.g., the binary data stored by the cell). The resistance of a programmed resistance variable memory cell can drift (e.g., shift) over time. Resistance drift can result in erroneous sensing of a resistance variable memory cell (e.g., a determination that the cell is in a state other than that to which it was programmed, among other issues).

A PCM cell, for example, may be programmed to a reset state (amorphous state) or a set state (crystalline state). A reset pulse (e.g., a pulse used to program a cell to a reset state) can include a relatively high current pulse applied to the cell for a relatively short period of time such that the phase change material of the cell melts and rapidly cools, resulting in a relatively small amount of crystallization. Conversely, a set pulse (e.g., a pulse used to program a cell to a set state) can include a relatively lower current pulse applied to the cell for a relatively longer time interval and with a slower quenching speed, which results in an increased crystallization of the phase change material.

A programming signal can be applied to a selected memory cell to program the cell to a target state. A read signal can be applied to a selected memory cell to read the cell (e.g., to determine the state of the cell). The programming signal and the read signal can be current and/or voltage pulses, for example.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
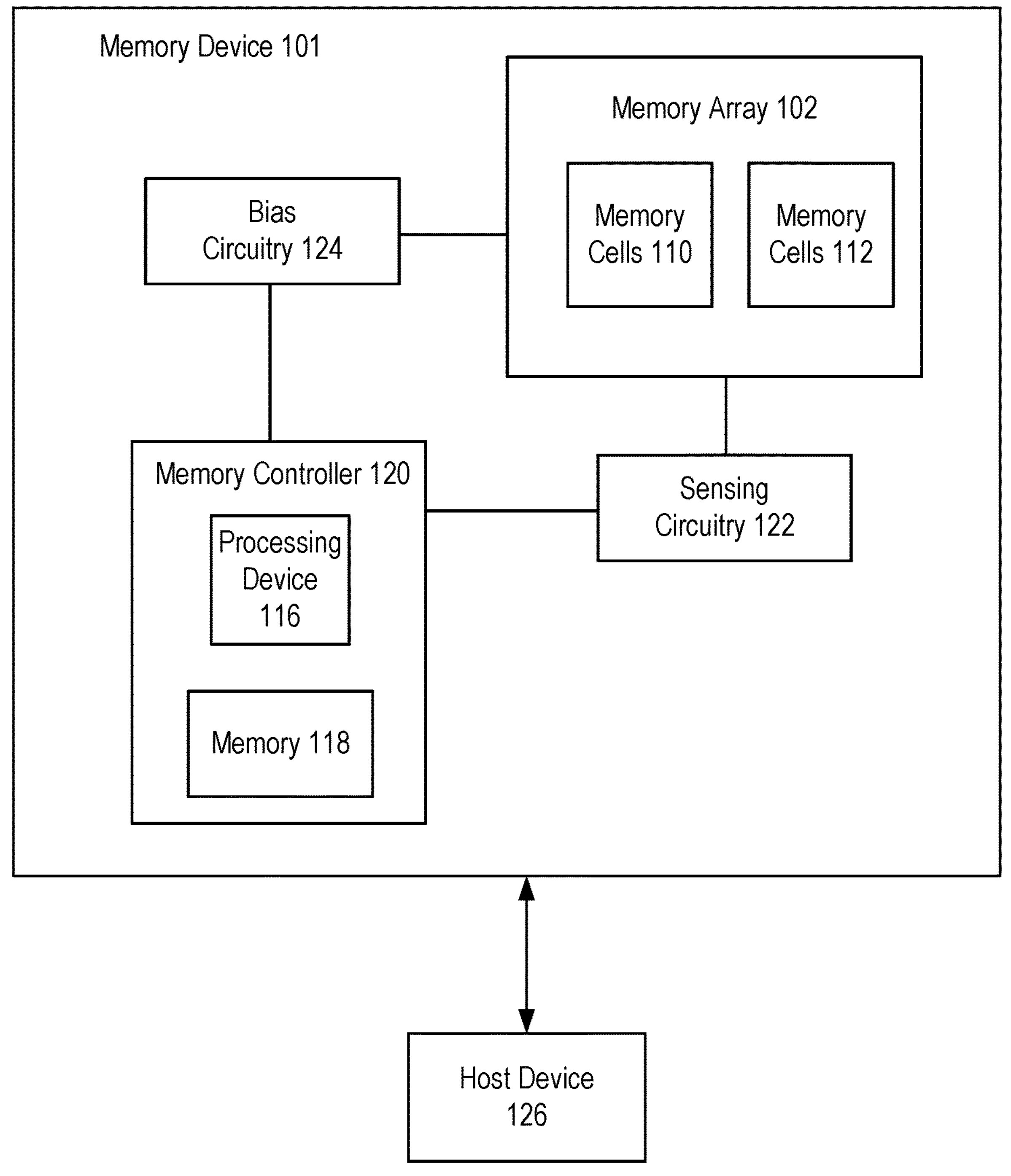
FIG. 1 shows a memory device that uses differential subthreshold reading of memory cells in a memory array, in accordance with some embodiments.

The following disclosure describes various embodiments for differential subthreshold reading of a memory cell pair in a memory device. At least some embodiments herein relate to memory devices that use bipolar operations for a memory array. For example, memory cells of the memory device are programmed by flipping or changing a polarity of programming voltages applied to the cells.

In some existing bipolar memory devices, bipolar select voltages are used to select memory cells of a memory array. In one example, the memory cells are arranged in a cross-point architecture (e.g., two-dimensional or three-dimensional). In one example, each memory cell is formed using a single select device. In one example, the select device includes a chalcogenide material that snaps or thresholds when a sufficient voltage is applied across the memory cell. In other embodiments, other phase change memory cells can be used in which the memory cell thresholds when a sufficient voltage is applied across the cell.

The memory device may, for example, store data used by a host device (e.g., a computing device of an autonomous vehicle, or another computing device that accesses data stored in the memory device). In one example, the memory device is a solid-state drive mounted in an electric vehicle.

In some cases, a memory device may include an array of memory cells arranged in a three-dimensional (3D) architecture, such as a cross-point architecture, to store the set of data. The memory cells in a cross-point architecture may, for example, represent a first logic state (e.g., a logic 1, a SET state) associated with a first set of threshold voltages, or a second logic state (e.g., a logic 0, a RESET state) associated with a second set of threshold voltages.

In other embodiments, the memory cells may be arranged in a three-dimensional (3D) vertical architecture. A 3D vertical architecture may include memory cells located at the crossing between a vertical access line (e.g., a bitline pillar), and each one of a plurality of second access lines (e.g., wordlines), formed in horizontal planes or decks parallel to each other.

More generally, an integrated circuit memory cell, such as a memory cell in a cross-point memory or a 3D vertical array, can be programmed to store data by the way of its state at a voltage applied across the memory cell. For example, if a memory cell is configured or programmed in such a state that allows a substantial current to pass the memory cell at a voltage in a predefined voltage region, the memory cell is considered to have been configured or programmed to store a first bit value (e.g., one or zero); and otherwise, the memory cell is storing a second bit value (e.g., zero or one).

Optionally, a memory cell can be configured or programmed to store more than one bit of data by being configured or programmed, for example, to have a threshold voltage in one of more than two separate voltage regions.

The threshold voltage of a memory cell is such that when the voltage applied across the memory cell is increased to above the threshold voltage, the memory cell changes rapidly or abruptly, snaps (e.g., for a chalcogenide memory cell), or changes (e.g., jumps) from a non-conductive state to a conductive state. The non-conductive state allows a small leak current to go through the memory cell; and in contrast, the conductive state allows more than a threshold amount of current to go through. Thus, a memory device can use a sensor (e.g., sense amplifier) to detect the change, or determine the conductive/non-conductive state of the memory device at one or more applied voltages, to evaluate or classify the level of the threshold voltage of the memory cell and thus its stored data.

The threshold voltage of a memory cell can be configured/programmed to be in different voltage regions used to represent different data values stored in the memory cell. For example, the threshold voltage of the memory cell can be programmed to be in any of four predefined voltage regions; and each of the regions can be used to represent the bit values of a different two-bit data item. Thus, when given a two-bit data item, one of the four voltage regions can be selected based on a mapping between two-bit data items and voltage regions; and the threshold voltage of the memory cell can be adjusted, programmed, or configured to be in the selected voltage region to represent or store the given two-bit data item. To retrieve, determine, or read the data item from the memory cell, one or more read voltages can be applied across the memory cell to determine which of the four voltage regions contain the threshold voltage of the memory cell. The identification of the voltage region that contains the threshold voltage of the memory cell provides the two-bit data item that has been stored, programmed, or written into the memory cell.

For example, a memory cell can be configured or programmed to store a one-bit data item in a Single Level Cell (SLC) mode, or a two-bit data item in a Multi-Level Cell (MLC) mode, or a three-bit data item in a Triple Level Cell (TLC) mode, or a four-bit data item in Quad-Level Cell (QLC) mode.

A memory device can be made up of memory cells that may be individually selected for purposes of performing operations such as, for example, reading and writing. A memory cell may store a piece of data such as, for example, a binary digit. Memory cells may be arranged in grid-like manner where they are selected by activating the row and the column of the memory cell. To select a memory cell, a conductive line corresponding to the row and a conductive line corresponding to the column may need to receive specific demarcation read voltages (VDMs). For example, data is encoded in a memory cell by modifying the cell properties to achieve a particular threshold voltage (Vt) of the cell. A cell is considered to turn on if the VDM is greater than the Vt of the cell. When VDM>Vt, the cell may conduct current. When VDM<Vt, the cell does not conduct current.

However, there can be disadvantages to using VDMs to read memory cells. For example, the circuitry used to generate VDMs may include complicated analog circuits such as current mirrors, reference voltage generators, and other biasing circuits that generate specific VDMs. Moreover, as a memory device is used over time, or as ambient temperature changes, different VDM levels may need to be generated. For example, a memory cell may experience Vt drift over time. As a result, a particular VDM level that may accurately measure the cell at the beginning of the cell's life (e.g., time zero), may not accurately measure the cell months or years later.

To address the disadvantages of VDMs above, some memory devices have an architecture that alleviates the need for managing and controlling demarcation read voltages (VDMs) when performing read operations. This is done by logically combining physical memory cells into a logical single bit. For example, this approach reduces the need for precise VDMs.

More specifically, a logical single bit is mapped to two physical cells, referred to as a memory cell pair (e.g., cell 1 and cell 2). Cell 1 and cell 2 of a memory cell pair store reciprocal values. For example, a logical binary "1" is stored such that cell 1 stores a binary "1" and cell 2 stores a binary "0." And a logical binary "0" is stored such that cell 1 stores a binary "0" and cell 2 stores a binary "1."

However, the logical single bit approach above requires that at least some memory cells snap or threshold as part of performing the read operation. This snapping can lead to increased energy consumption being required for the read operation. Also, the snapping can increase the stress that accumulates on memory cells over time.

To address the technical problems of increased energy consumption and/or stress of the single bit approach above, a differential read of a memory cell pair is performed while the memory cells of the pair are in a subthreshold mode. This avoids the snapping of memory cells that is used in the single bit approach above.

In one embodiment, two detectors are used for reading a memory cell pair. A memory device includes a memory array having a first memory cell and a second memory cell. The first memory cell is selected using a wordline and a first digit line. The second memory cell is selected using the wordline and a second digit line.

It should be noted that digit lines are sometimes referred to herein as bitlines. Digit lines and bitlines are generally used herein as interchangeable terms. For example, a pillar can be referred to as being part of either a bitline or digit line.

A first detector is coupled to the first memory cell, and the first detector outputs a first logic state. A second detector is coupled to the second memory cell, and the second detector outputs a second logic state. The first and second logic states are determined while the first and second memory cells are in a subthreshold mode.

A feedback circuit controls, based on the first and second logic states, a voltage on the first digit line, and a voltage on the second digit line. This control is used to avoid the first and second memory cells from thresholding (e.g., switching, or snapping).

In another embodiment, a single detector is used for reading a memory cell pair. A memory device includes a first memory cell and a second memory cell. The first memory cell is selected using a wordline and a first digit line. The second memory cell is selected using the wordline and a second digit line.

A detector has the first and second digit lines as inputs, and an output of the detector is determined based on a difference in leakage currents of the first and second memory cells. The output of the detector is determined while the first and second memory cells are in a subthreshold mode.

A controller of the memory device biases the wordline by increasing a magnitude of a voltage applied to the wordline (e.g., using a ramp). This increasing of the magnitude increases the leakage currents of the first and second memory cells to perform the read. In one example, the read is complete when the leakage current for at least one of the cells reaches a threshold voltage. A feedback circuit reduces a magnitude of voltages applied to the first and second digit lines based on the output of the detector.

In one embodiment, a differential read of a bit held in two different memory cells is performed. The memory cells are read in subthreshold mode by comparing leakage of the first cell with leakage of the second cell. In one example, by using this approach, a memory device can read a large number of memory cells on a single wordline. For example, this can reduce energy consumption dramatically.

In one example, a pair of memory cells in a memory array stores one of two possible data states (e.g., 10 or 01). The digit lines used to select the memory cells are held at a fixed positive value (e.g., +2-4 V). A wordline that is common to the cell pair is biased with a negative voltage ramp starting from an initial voltage (e.g., ground or −1 V) and gradually increasing the wordline voltage to greater negative values (e.g., −2 to −4 V). One memory cell of the pair will exhibit a leakage higher than the other cell. In one example, other wordlines of the memory array are biased to ground so that other memory cells in the memory array have a very low leakage that can be compensated during the read.

In one embodiment, the data read from each memory cell provides an input to a logic gate. In one example, the logic states (e.g., logic 0 or 1) of first and second memory cells is read and provided as two inputs (e.g., inputs of 0 and 1, or 1 and 0) to a NAND gate. The output of the NAND gate (e.g., 1) indicates that the reading of the memory cell pair is complete. For example, the output may be monitored by a controller that is signaled of the read completion by this output.

For example, in response to the output of the NAND gate transitioning from an initial value (e.g., logic 0) prior to the read to a different value (e.g., logic 1) after the read, the digit lines to the memory cell pair are biased with a negative voltage. This biasing is to avoid the thresholding (e.g., switching or snapping) of either of the memory cells.

In one embodiment, this biasing is implemented by a feedback circuit that uses the NAND gate output as a control input. In one embodiment, this biasing can be initiated by the controller based on the NAND gate output. The ramping of the wordline voltage during the read operation is done sufficiently slowly so as to allow the voltage of the two digit lines to be decreased before any switching of either memory cell might occur.

In one embodiment, the logic state for each of the two memory cells in the pair is determined using respective inverter detectors. The detectors have almost zero dynamic energy consumption, so the energy consumption of the circuitry is minimal. In an alternative embodiment, the logic state of the memory cell pair is determined using a single inverter detector.

Advantages achieved by at least some embodiments herein include power reduction. Another advantage is that the subthreshold read above does not exceed the threshold voltage of the memory cells, further reducing the voltage biasing requirements for performing the read. Also, the memory cells do not switch during the read. This lowers the cumulative stress on the cells over many reads.

FIG. 1 shows a memory device that uses differential subthreshold reading of memory cells in a memory array 102, in accordance with some embodiments. Memory cells 110 and 112 are located, for example, in memory array 102. For example, memory cells 110 and 112 may be located in different partitions or tiles of memory array 102. Memory device 101 applies voltages to memory cells 110, 112 when performing read, write, or other operations.

Memory device 101 has a memory controller 120 that controls the applied voltages. Memory controller 120 includes one or more processing devices 116 and memory 118. In one example, memory 118 stores firmware executed by processing device 116 to apply read or write voltages (e.g., a series of pulses).

Memory controller 120 can use bias circuitry 124 to generate voltages for applying read, write and other voltages. For example, bias circuitry 124 generates voltage waveforms for applying write voltages to memory cells 110, 112 as part of programming operations.

In some cases, bias circuitry 124 is used to generate read voltages for read operations performed on memory array 102 (e.g., in response to a read command from host device 126). In one example, the read operation reads a memory cell pair in memory cells 110. In one example, the read operation reads a codeword comprising bits (e.g., 128 bits). Each of the bits corresponds to a memory cell pair in memory cells 110.

In some embodiments, memory device 101 includes sensing circuitry 122, which is used to sense a state of each memory cell in memory array 102. In one example, sensing circuitry 122 includes sense amplifiers used to detect a current caused by applying various voltages to memory cells in memory array 102. In one example, bias circuitry 124 applies a write voltage to memory cells 110. In some cases, sensing circuitry 122 senses a current associated with each of the memory cells 110 caused by applying the write voltage to determine if the cell has snapped.

In other embodiments, sensing circuitry 122 includes sense amplifiers used to detect leakage currents in memory cells of memory cell pairs as described above. Each sense amplifier may be coupled to a digit line of a memory cell pair. The outputs of the sense amplifier correspond to a leakage current associated with the memory cell selected by the digit line. In one example, the output of each sense amplifier is provided as an input to an inverter detector as discussed above.

In one example, if sensing circuitry 122 determines that the current for a memory cell is greater than a fixed threshold (e.g., a predetermined level of current), then memory controller 120 determines that the memory cell has snapped, or that the memory cell is in a given logic state. In one example, sensing circuitry 122 additionally or alternatively determines an output based on a comparison of leakage currents for two memory cells in a memory cell pair, as described in more detail below.

In one embodiment, memory cells 110 and memory cells 112 correspond to different memory types (e.g., single level cell, or multi-level cell). In one example, the material used to form a select device of each memory cell is different. The read or write voltage applied to memory cells 110 corresponds to the material used to form memory cells 110.

In one embodiment, memory controller 120 receives a write command from a host device 126. The write command is accompanied by data (e.g., user data of a user of host device 126) to be written to memory array 102. In response to receiving the write command, controller 120 initiates a write operation.

In one example, controller 120 uses write voltages (e.g., write pulses) to write a logic state to a memory cell, such as memory cell 110, 112 during a write operation. The write pulses may be applied by providing a first voltage to a bitline and providing a second voltage to a wordline to select the memory cell. Circuits coupled to access lines to which memory cells may be coupled may be used to provide the write voltages (e.g., access line drivers included in decoder circuits). The circuits may be controlled by internal control signals provided by a control logic (e.g., controller 120). The resulting voltage applied to the memory cell is the difference between the first and second voltages. The write pulses may be the same duration as read pulses in some embodiments. In some embodiments the duration is 10-50 ns. In some embodiments, the duration is 1-100 ns. In some embodiments, the duration is 1 ns to 1 microsecond. Writing to the memory cell may take the same time as reading the memory cell in some embodiments.

In one example, the polarity of the read or write pulses may be either a first polarity or a second polarity. For example, a read or write pulse may apply a voltage to a memory cell in a first polarity (e.g., bitline at +6V and wordline −2.5V).

In one example, after being accessed (e.g., selected), a memory cell or cell pair may be sensed by a sense component (e.g., sensing circuitry 122) to determine the stored state of the memory cell or memory cell pair. For example, a voltage may be applied to the memory cell(s) (using a wordline and bitline(s)) and the presence of a resulting current(s) may depend on the applied voltage and the threshold voltage and/or leakage characteristics of the memory cell. In some cases, more than one voltage may be applied. Additionally, if an applied voltage does not result in current flow (e.g., failure of cell to snap, or leakage current that is too low depending on read mode), other voltages (e.g., of increased magnitude; ramping of wordline voltage as discussed above) may be applied until an appropriate or suitable current is detected by the sense component.

By assessing the voltage(s) that resulted in current(s) flow, the stored logic state of the memory cell may be determined. In some cases, the voltage may be ramped up in magnitude until a current flow is detected (e.g., leakage currents of a memory cell pair is sufficient for a logic state to be detected by inverter detector(s), or a memory cell turns on, switches on, conducts current, or becomes activated). In other cases, predetermined voltages may be applied sequentially until a suitable current(s) is detected.

In some cases, the memory cell (e.g., a PCM cell) includes a material that changes its crystallographic configuration (e.g., between a crystalline phase and an amorphous phase), which in turn, determines a threshold voltage of the memory cell to store information. In other cases, the memory cell includes a material that remains in a crystallographic configuration (e.g., an amorphous phase) that may exhibit variable threshold voltages to store information.

The sense component may include various transistors or amplifiers in order to detect and amplify a difference in signals from the memory cell(s). The detected logic state of the memory cell(s) may then be output through a column decoder as output. In some cases, the sense component may be part of a column decoder or a row decoder.

Figure 2:
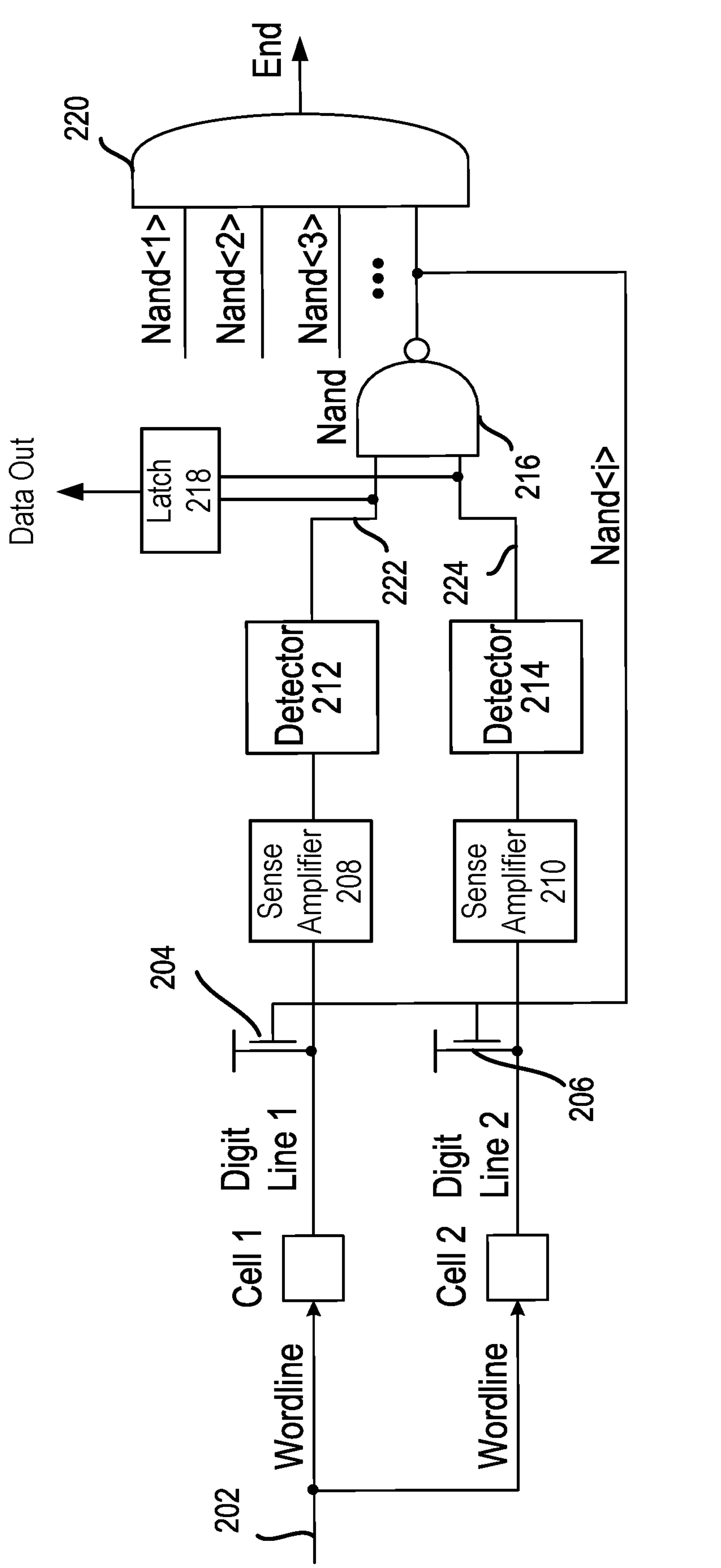
FIG. 2 shows detectors used to determine a logic state of a memory cell pair and a feedback circuit to control digit line voltages, in accordance with some embodiments.

FIG. 2 shows detectors 212, 214 used to determine a logic state of a memory cell pair and a feedback circuit to control digit line voltages, in accordance with some embodiments. The memory cell pair includes cell 1 and cell 2. In one example, the memory cell pair is a pair of memory cells 110 or 112.

The feedback circuit includes logic gate 216 and transistors 204, 206. For example, as illustrated, logic gate 216 is a NAND gate. In other embodiments, various types of comparators can be used instead of logic gate 216. The output of logic gate 216 is coupled to the gates of transistors 204, 206 to control a voltage on digit lines 1, 2.

A voltage is applied to digit lines 1, 2, and a voltage is applied to wordline 202 to select the memory cell pair for reading. Sense amplifiers 208 and 210 are coupled to digit lines 1, 2, which provide inputs to the sense amplifiers 208, 210. Based on leakage currents sensed by each sense amplifier in the corresponding memory cell, each sense amplifier provides an output signal that is amplified. The output of each sense amplifier 208, 210 is provided as an input to detectors 212, 214, respectively.

In one example, each sense amplifier uses a cascode sensing structure to detect a leakage current respectively associated with memory cell 1, 2.

The outputs 222, 224 of detectors 212, 214 correspond to a detected logic state of the corresponding memory cell. For example, output 222 can have a value of logic zero, and output 224 can have a value of logic one. Outputs 222, 224 are provided as inputs to NAND gate 216.

In one embodiment, outputs 222, 224 provide data outputs (e.g., logic states of each memory cell such as 01 or 10) as a result from a read operation that reads the memory cell pair. The data out value for a logical bit corresponding to the memory cell pair is latched by latch 218 in response to the output (e.g., Nand<i>) of NAND gate 216 indicating completion of the read of the memory cell pair. In one example, the data out value for the logical bit is one of numerous bits of a codeword being read by a controller in response to a read command. In one example, the read command is received from a host device.

In one embodiment, each memory cell pair of multiple pairs (e.g., 128 pairs for 128 bits) is read by respective sense amplifiers 208, 210 and detectors 212, 214. Each such memory cell pair has an output signal Nand<i> from logic gate 216 that is provided as an input to logic gate 220 (e.g., a NAND gate). For example, inputs Nand<1, 2, 3, . . . , i> are provided to logic gate 220 when reading a codeword or other block or logical unit from a portion of a memory array (e.g., from a partition). Logic gate 220 provides an output signal (End) that indicates the completion of reading all memory cell pairs associated with, for example, a codeword or other defined logical unit.

The output signal End can indicate, for example, to controller that the codeword has been fully read. In response, the controller can take additional actions such as returning a data value or result to a host device in reply to a read command received from the host device.

Figure 3:
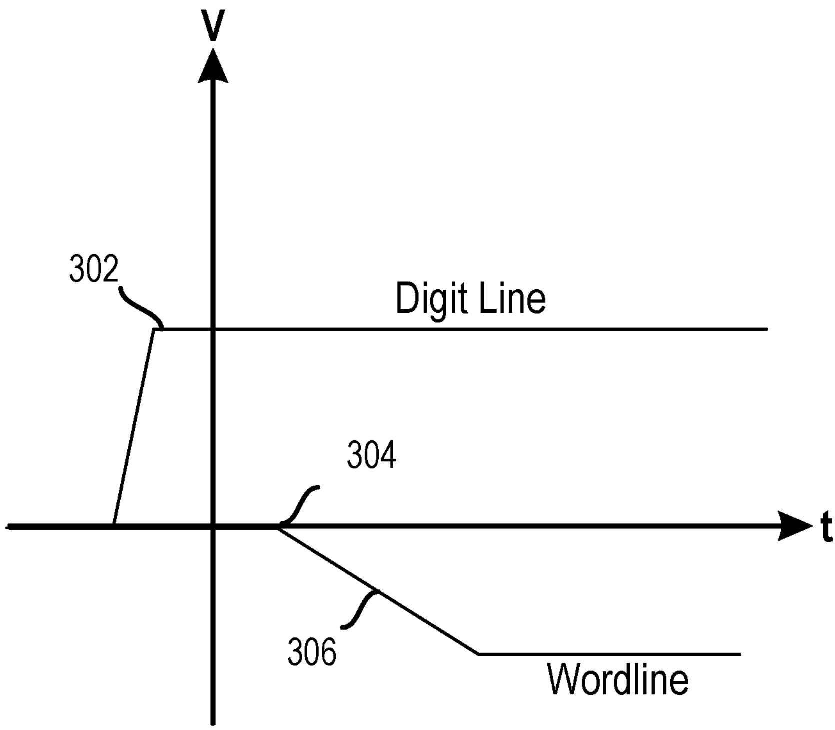
FIG. 3 shows exemplary digit line and wordline voltages applied to a memory cell pair during a read operation, in accordance with some embodiments.

FIG. 3 shows exemplary digit line and wordline voltages applied to a memory cell pair during a read operation, in accordance with some embodiments. In one embodiment, voltages are applied to the wordline and digit lines using wordline and digit line drivers. In one example, these drivers are part of bias circuitry 124.

As illustrated, a voltage applied to each digit line for a memory cell pair is initially increased to a voltage 302. In one example, the voltage 302 is maintained at a fixed value during the read operation.

As illustrated, a voltage applied to the wordline starts at an initial value 304. In one example, initial value 304 is ground or a negative voltage (e.g., of a magnitude just below the E1 edge of a SET distribution). During the read operation, a controller ramps the voltage applied to the wordline using a ramp 306. Ramp 306 increases the magnitude of the voltage applied to the wordline. In the illustrated example, ramp 306 makes the voltage applied to the wordline more negative. As the voltage is ramped, the voltage across each of the memory cells in a memory cell pair increases. This increases the leakage current of each memory cell.

In one embodiment, the leakage current of each memory cell depends on the logic state to which the cell has been programmed (e.g., SET or RESET). This difference in leakage current can be determined using sense amplifiers, detectors, and one or more logic gates, as discussed above.

In one example, voltage 302 is a positive voltage applied to digit lines 1, 2 of FIG. 2. Voltage 304 and ramp 306 are applied to wordline 202. Once the memory cell pair is read, ramp 306 is stopped by a controller. The controller may determine the end of the read based on an output of logic gate 216.

The output of logic gate 216 also controls transistors 204, 206 to reduce the voltage on the digit lines 1, 2 to avoid switching of the memory cells 1, 2. In one example, transistors 204, 206 are n-type MOS devices having one current terminal connected to the digit line, and another current terminal connected to a negative voltage source or ground. The gate of each transistor is coupled to and controlled by the output of logic gate 216.

Figure 4:
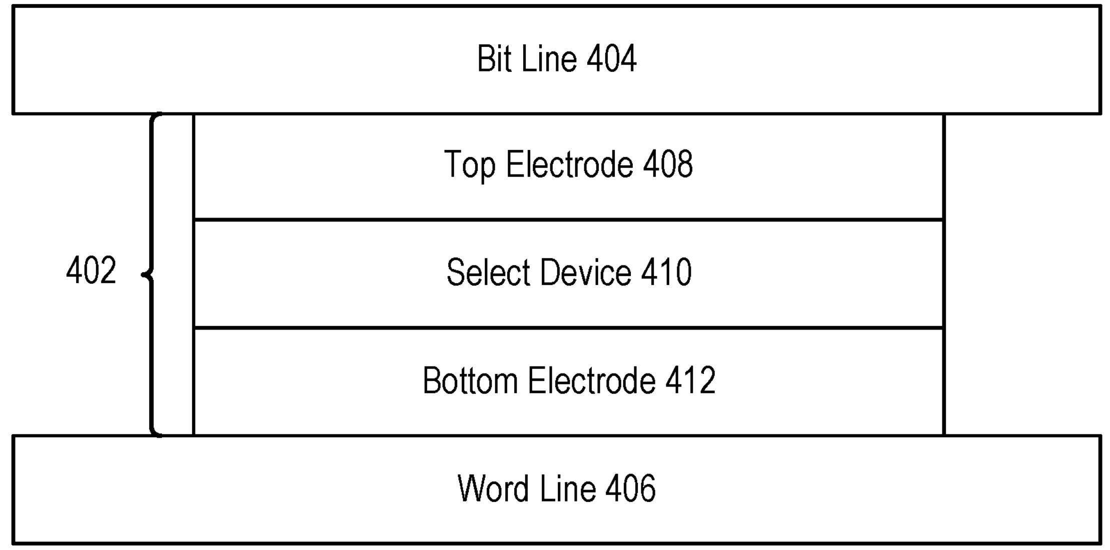
FIG. 4 shows an example of a memory cell that includes a select device, in accordance with some embodiments.

FIG. 4 shows an example of a memory cell 402 that includes a select device, in accordance with some embodiments. The memory cell 402 is an example of memory cell 110. In one example, the memory cell is cell 1 or 2 of FIG. 2. In one example, select device 410 includes a chalcogenide.

Top electrode 408 conductively connects select device 410 to digit line or bitline 404, and bottom electrode 412 conductively connects select device 410 to wordline 406. In one example, electrodes 408, 412 are formed of a carbon material.

In one example, select device 410 includes a chalcogenide (e.g., chalcogenide material and/or chalcogenide alloy). Threshold voltage properties of the select device may be based on the voltage polarities applied to the memory cell.

In one example, a logic state may be written to memory cell 402, which may correspond to one or more bits of data. A logic state may be read from or written to the memory cell by applying voltages of different polarities at different voltage and/or current magnitudes. The reading and writing protocols may take advantage of different threshold voltages of the select device that result from the different polarities. In other words, when the memory cell is a self-selecting memory cell implemented using a selector/memory device, the select device 410 may be used as both a selecting element and a storage element of the cell 402.

Figure 5:
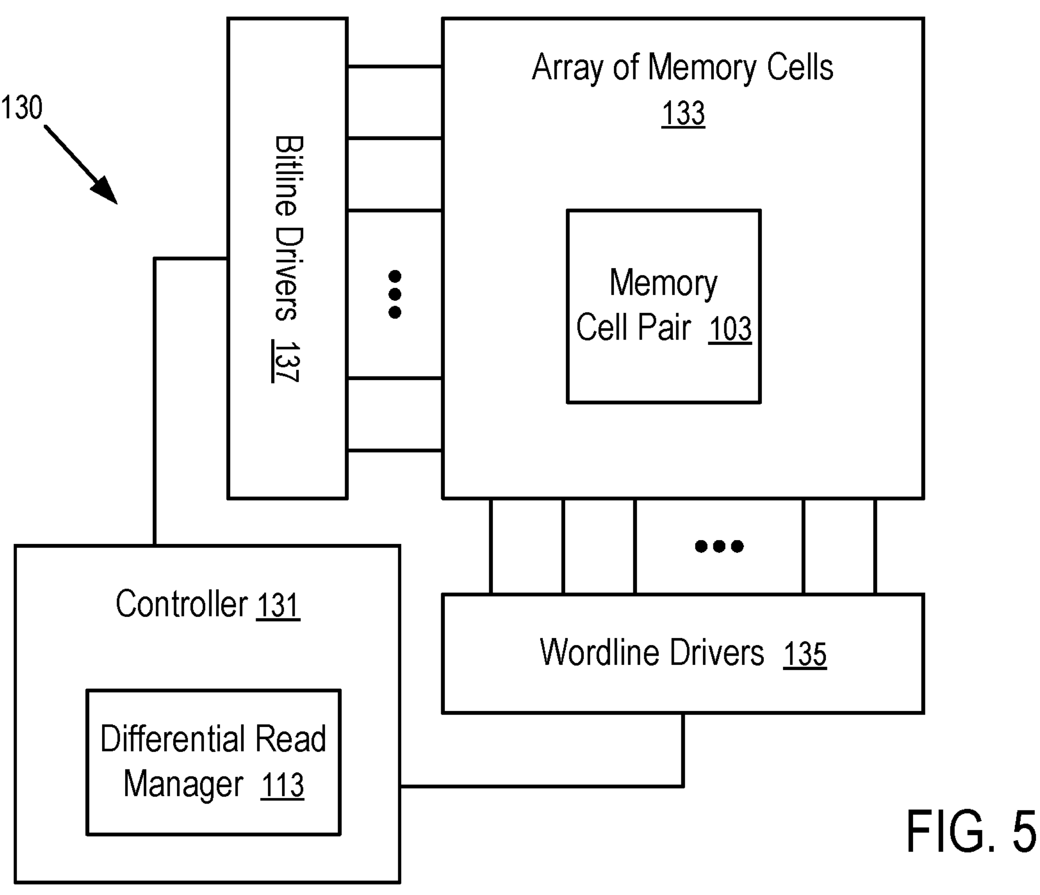
FIG. 5 shows a memory device configured with a differential read manager according to one embodiment.

FIG. 5 shows a memory device 130 configured with a differential read manager 113 according to one embodiment. Memory device 130 is an example of memory device 101. In FIG. 5, the memory device 130 includes an array 133 of memory cell pairs, such as a memory cell pair 103. In one example, an array 133 can be referred to as a tile (or multiple tiles); and a memory device (e.g., 130) can have one or more tiles. Different tiles can be operated in parallel in a memory device (e.g., 130).

For example, the memory device 130 illustrated in FIG. 5 can have a cross-point memory having at least the array 133 of memory cell pairs (e.g., 103). In another example, the memory device 130 illustrated in FIG. 5 can have a 3D vertical architecture having at least the array 133 of memory cell pairs (e.g., 103).

In some implementations, the cross-point memory uses memory cells that have an element (e.g., a sole element) acting both as a selector device and a memory device. For example, the memory cell can use a single piece of alloy with variable threshold capability. The read/write operations of such a memory cell can be based on thresholding the memory cell while inhibiting other cells in sub-threshold bias, in a way similar to the read/write operations for a memory cell having a first element acting as a selector device and a second element acting as a phase-change memory device that are stacked together as a column. A selector device usable to store information can be referred to as a selector/memory device.

The memory device 130 of FIG. 5 includes a controller 131 that operates bitline drivers 137 and wordline drivers 135 to access the individual memory cells (e.g., cells of pair 103) in the array 133. For example, each memory cell in the array 133 can be accessed via voltages driven by a pair of a bitline driver 147 and a wordline driver 145, as illustrated in FIG. 6.

The controller 131 includes a differential read manager 113 configured to implement a process that performs a differential subthreshold read as described herein. The differential read manager 113 can be implemented, for example, via logic circuits and/or microcodes/instructions.

In one example, the differential read manager 113 controls voltages applied to digit line drivers and a wordline driver for reading a memory cell pair. The differential read manager 113 determines actions to take based on the output of logic gate 216 and/or the output of logic gate 220. The differential read manager 113 obtains a data output result from latch 218.

Figure 6:
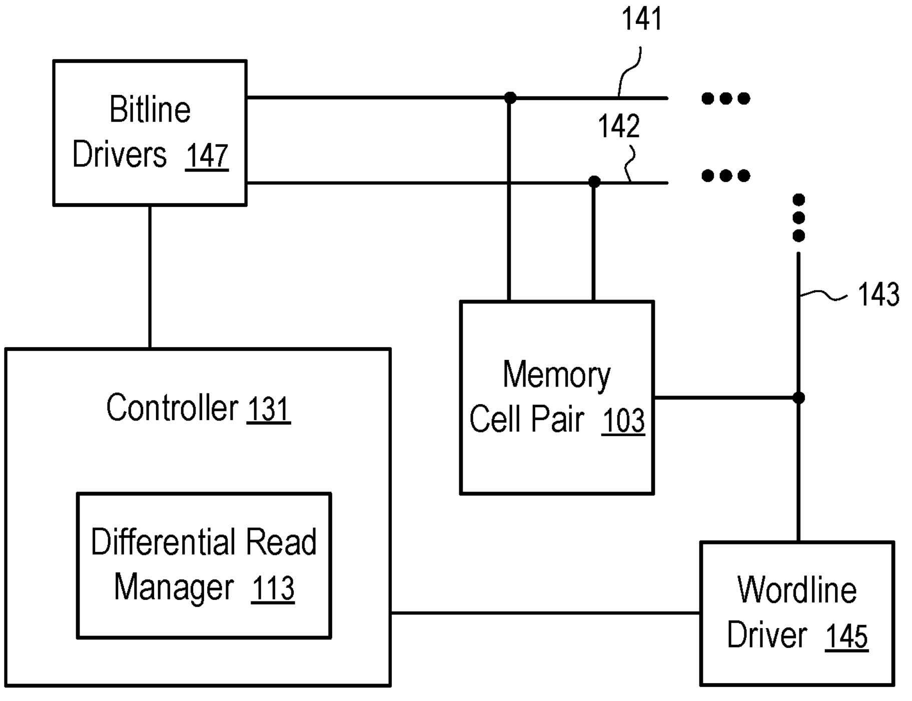
FIG. 6 shows a memory cell pair with a bitline driver and a wordline driver configured to apply voltage pulses according to one embodiment.

FIG. 6 shows a memory cell pair 103 with bitline drivers 147 and wordline driver 145 configured to apply voltages (e.g., pulses) to memory cell pair 103 according to one embodiment. For example, the memory cell pair 103 can be a typical memory cell pair 103 in the memory cell array 133 of FIG. 6.

The bitline drivers 147 and the wordline driver 145 of FIG. 6 are controlled by controller 131 to selectively apply one or more voltages to each memory cell of the pair 103 (e.g., during a read operation). The bitline drivers 147 and the wordline driver 145 can apply voltages of different polarities on the memory cell pair 103.

For example, in applying one polarity of voltage (e.g., positive polarity), each bitline driver 147 drives a positive voltage relative to the ground on bitlines 141, 142; and the wordline driver 145 drives a negative voltage relative to the ground on a wordline 143.

In applying the opposite polarity of voltage (e.g., negative polarity), each bitline driver 147 drives a negative voltage on the bitlines 141, 142; and the wordline driver 145 drives a positive voltage on the wordline 143.

Each memory cell in pair 103 is subjected to the voltage difference between the voltage driven by the respective bitline driver 147 on the bitline 141, 142 and the voltage driven by the wordline driver 145 on the wordline 143.

In general, when the voltage driven by the bitline driver 147 is higher than the voltage driven by the wordline driver 145, the memory cell is subjected to a voltage in one polarity (e.g., positive polarity); and when the voltage driven by the bitline driver 147 is lower than the voltage driven by the wordline driver 145, the memory cell is subjected to a voltage in the opposite polarity (e.g., negative polarity).

In some implementations, the memory cell is a self-selecting memory cell implemented using a selector/memory device. The selector/memory device has a chalcogenide (e.g., chalcogenide material and/or chalcogenide alloy). For example, the chalcogenide material can include a chalcogenide glass such as, for example, an alloy of selenium (Se), tellurium (Te), arsenic (As), antimony (Sb), carbon (C), germanium (Ge), and silicon (Si). A chalcogenide material can primarily have selenium (Se), arsenic (As), and germanium (Ge) and be referred to as SAG-alloy. SAG-alloy can include silicon (Si) and be referred to as SiSAG-alloy. In some embodiments, the chalcogenide glass can include additional elements such as hydrogen (H), oxygen (O), nitrogen (N), chlorine (Cl), or fluorine (F), each in atomic or molecular forms.

In one embodiment, the selector/memory device has a top side and a bottom side. A top electrode is formed on the top side of the selector/memory device for connecting to a bitline 141, 142; and a bottom electrode is formed on the bottom side of the selector/memory device for connecting to a wordline 143. For example, the top and bottom electrodes can be formed of a carbon material. For example, a chalcogenide material of the memory cell can take the form of a crystalline atomic configuration or an amorphous atomic configuration. The threshold voltage of the memory cell can be dependent on the ratio of the material in the crystalline configuration and the material of the amorphous configuration in the memory cell. The ratio can change under various conditions (e.g., having currents of different magnitudes and directions going through the memory cell).

A self-selecting memory cell, having a selector/memory device, can be programmed to have a threshold voltage window. The threshold voltage window can be created by applying programming pulses with opposite polarity to the selector/memory device. For example, the memory cell can be biased to have a positive voltage difference between two sides of the selector/memory device and alternatively, or to have a negative voltage difference between the same two sides of the selector/memory device. When the positive voltage difference is considered in positive polarity, the negative voltage difference is considered in negative polarity that is opposite to the positive polarity. Reading can be performed with a given/fixed polarity.

For example, to program the voltage threshold of the memory cell, a bitline driver 147 and the wordline driver 145 can drive a pulse of voltage onto the memory cell in one polarity (e.g., positive polarity) to snap the memory cell such that the memory cell is in a conductive state. While the memory cell is conductive, the bitline driver 147 and the wordline driver 145 continue driving the programming pulse to change the threshold voltage of the memory cell towards a voltage region that represents the data value(s) to be stored in the memory cell.

The array of memory cells 133 can be configured in an integrated circuit having a plurality of decks of memory cells. Each deck can be sandwiched between a layer of bitlines, a layer of wordlines; and the memory cells in the deck can be arranged in an array 133. A deck can have one or more arrays or tiles. Adjacent decks of memory cells may share a layer of bitlines (e.g., 141, 142) or a layer of wordlines (e.g., 143). Bitlines are arranged to run in parallel in their layer in one direction; and the wordlines are arranged to run in parallel in their layer in another direction orthogonal to the direction of the bitlines. Each of the bitlines is connected to a row of memory cells in the array; and each of the wordlines is connected to a column of memory cells in the array. Bitline drivers 137 are connected to bitlines in the decks; and wordline drivers 135 are connected to wordlines in the decks. Thus, a typical memory cell is connected to a bitline driver 147 and a wordline driver 145.

In some embodiments, the threshold voltage of a typical memory cell is configured to be sufficiently high such that when only one of its bitline driver 147 and wordline driver 145 drives a voltage in either polarity while the other voltage driver holds the respective line to the ground, the magnitude of the voltage applied across the memory cell is insufficient to cause the memory cell to become conductive. Thus, addressing the memory cell can be performed via both of its bitline driver 147 and wordline driver 145 driving a voltage in opposite polarity relative to the ground for operating/ selecting the memory cell. Other memory cells connected to the same wordline driver 145 can be de-selected by their respective bitline drivers holding the respective bitlines to the ground; and other memory cells connected to the same bitline driver can be de-selected by their respective wordline drives holding the respective wordlines to the ground.

A group of memory cells connected to a common wordline driver 145 can be selected for parallel operation by their respective bitline drivers (e.g., 147) driving up the magnitude of voltages in one polarity while the wordline driver 145 is also driving up the magnitude of a voltage in the opposite polarity. Similarly, a group of memory cells connected to a common bitline driver 147 can be selected for parallel operation by their respective wordline drivers (e.g., 145) driving voltages in one polarity while the bitline driver 147 is also driving a voltage in the opposite polarity.

At least some examples are disclosed herein in reference to a cross-point memory having self-selecting memory cells. Other types of memory cells and/or memory can also be used. For example, memory cells each having a selector device and a phase-change memory device can also be used in at least some embodiments. Additionally or alternatively, the memory can have a different architecture, such as a 3D vertical architecture.

Figure 7:
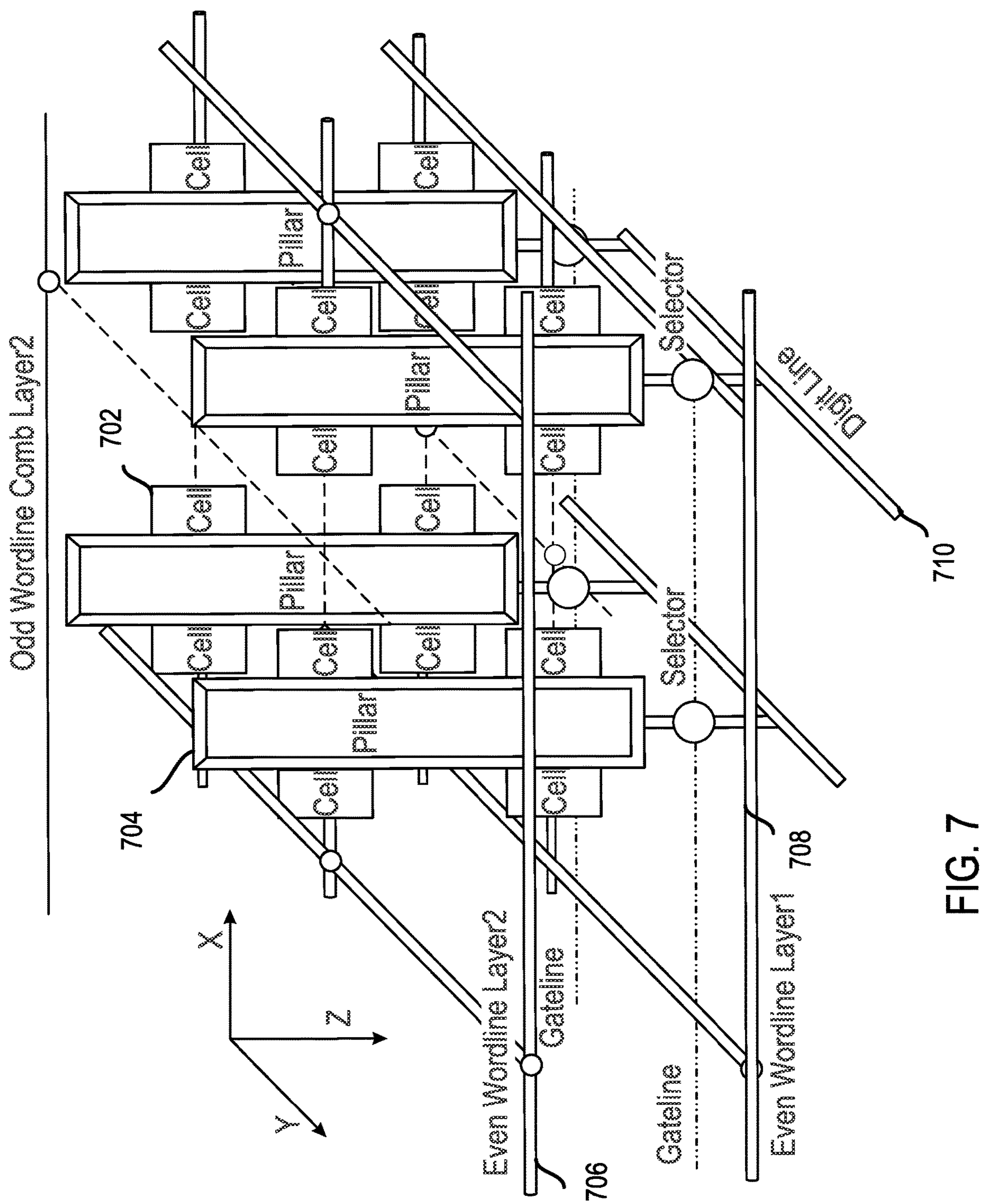
FIG. 7 shows an exemplary three-dimensional memory array structure, in accordance with some embodiments.

FIG. 7 shows an exemplary three-dimensional memory array structure, in accordance with some embodiments. The differential subthreshold read approach described herein is not limited to use in a planar architecture (e.g., with cells at crossing of WLs and BLs on different levels). Instead, the approach also can be used for vertical architectures (e.g., BL pillars crossing WL planes).

An example of a vertical architecture that can be used with embodiments described in this disclosure is illustrated in FIG. 7. As illustrated, a memory array includes memory cells 702. Each memory cell 702 can be selected using a wordline (e.g., 706 or 708) and a digit line (e.g., 710).

In one embodiment, each wordline extends in one of a plurality of horizontal planes of wordlines 706, 708 stacked vertically above a semiconductor substrate (not shown). Each digit line (e.g., 710) includes a pillar 704. Each pillar 704 extends vertically away from the semiconductor substrate. Each memory cell 702 is located on sides of one of pillars 704.

Figure 8:
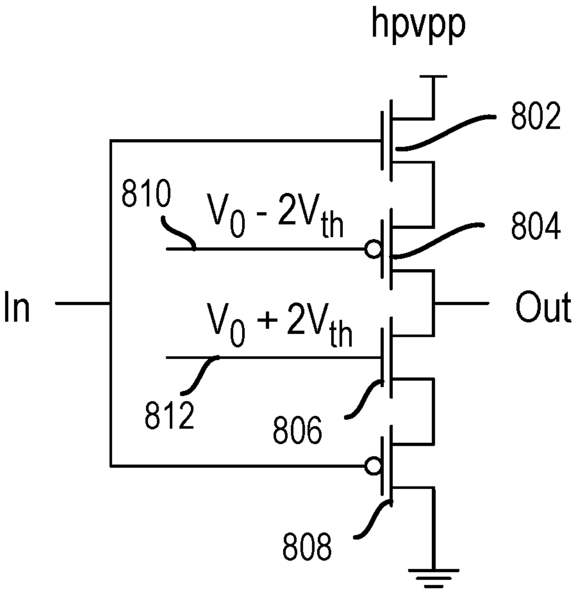
FIG. 8 shows an inverter detector using reference voltage inputs, in accordance with some embodiments.

FIG. 8 shows an inverter detector using reference voltage inputs 810, 812, in accordance with some embodiments. The inverter detector is an example of detector 212, 214. The input to the detector is, for example, the output from sense amplifier 208 or 210.

The detector receives input (In) and provides output (Out). The detector has transistors 802, 804 connected in series between a positive voltage source (e.g., hpvpp) and the output. The detector also has transistors 806, 808 connected in series between a negative voltage source or ground and the output.

Transistors 802, 806 are n-type MOS devices, and transistors 804, 808 are p-type MOS devices. Reference voltage input 810 is provided to the gate of transistor 804. Reference voltage 812 is provided to a gate of transistor 806.

In one example, reference voltage 810 is a nominal (e.g., predefined or selected) voltage $V_0$ minus threshold voltages ($2V_{th}$) corresponding to each of transistors 802 and 804. Reference voltage 812 is a nominal voltage $V_0$ plus threshold voltages corresponding to each of transistors 806 and 808.

Figure 9:
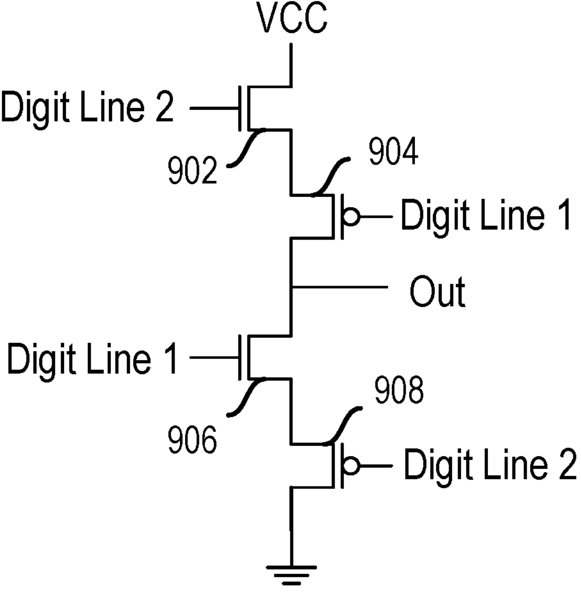
FIG. 9 shows an inverter detector providing an output based on first and second digit line inputs, in accordance with some embodiments.

FIG. 9 shows an inverter detector providing an output based on first and second digit line inputs (e.g., Digit Line 1, Digit Line 2), in accordance with some embodiments. The detector is an example of detector 1016 of FIG. 10 discussed below. The inputs to the detector are, for example, the outputs of sense amplifiers 1012, 1014 of FIG. 10. The inputs to the detector have voltages that correspond to voltages on digit lines used to select a memory cell pair that is being read.

The output from the detector is based on a difference between the voltage inputs to the detector. In one example, the output of the detector is an input to feedback circuit 1020 of FIG. 10. In one embodiment, the output from the detector corresponds to a difference in leakage currents between two memory cells in a memory cell pair when being read in a subthreshold mode.

The detector has transistors 902, 904 connected in series between a positive voltage source (e.g., VCC) and the output of the detector. The detector has transistors 906, 908 connected in series between a negative voltage source or ground, and the output of the detector. A first digit line is coupled to a gate of transistor 904 and a gate of transistor 906. A second digit line is coupled to a gate of transistor 902 and a gate of 908.

Transistors 902, 906 are, for example, n-type MOS devices. Transistors 904, 908 are, for example, p-type MOS devices.

Figure 10:
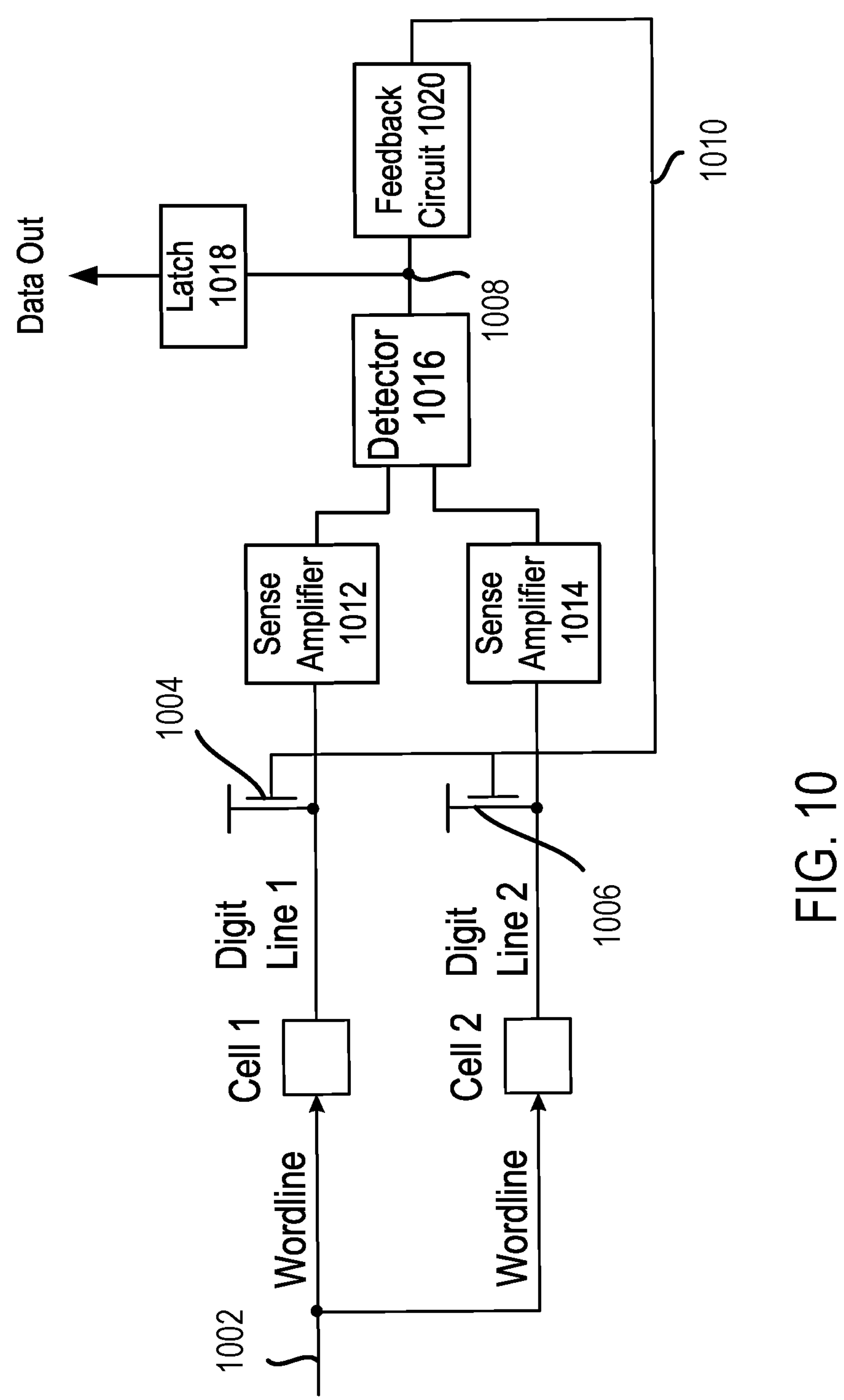
FIG. 10 shows a detector that determines a logic state of a memory cell pair in a read operation using a feedback circuit to control digit line voltages, in accordance with some embodiments.

FIG. 10 shows a detector 1016 that determines a logic state of a memory cell pair in a read operation using a feedback circuit 1020 to control digit line voltages, in accordance with some embodiments. The inverter detector of FIG. 9 is an example of detector 1016.

The memory cell pair includes two memory cells 1, 2. These memory cells are selected using wordline 1002 and digit lines 1, 2. The memory cells are read while in a subthreshold mode. Voltages on the digit lines 1, 2 are sensed by sense amplifiers 1012, 1014, each of which amplifies the respective signals to provide inputs to detector 1016. Detector 1016 provides output 1008 which corresponds to the logic state of the memory cell pair (e.g., logic one or zero). Output 1008 is latched by latch 1018 to provide a data output (e.g., for reading by a controller). In one example, the data output is returned in reply to a read command from a host device.

Once the logic state is determined by detector 1016, output 1008 provides an input to feedback circuit 1020 that is used to reduce the digit line voltages. An output signal 1010 from feedback circuit 1020 controls transistors 1004 and 1006 to reduce voltages on digit lines 1, 2. In one example, transistors 1004, 1006 are constructed and operated similarly to transistors 204, 206 of FIG. 2.

The control of the voltages on digit lines 1, 2 by feedback circuit 1020 avoids memory cells 1, 2 from switching during the read operation. In one example, feedback circuit 1020 includes one or more logic gates and/or inverters.

Figure 11:
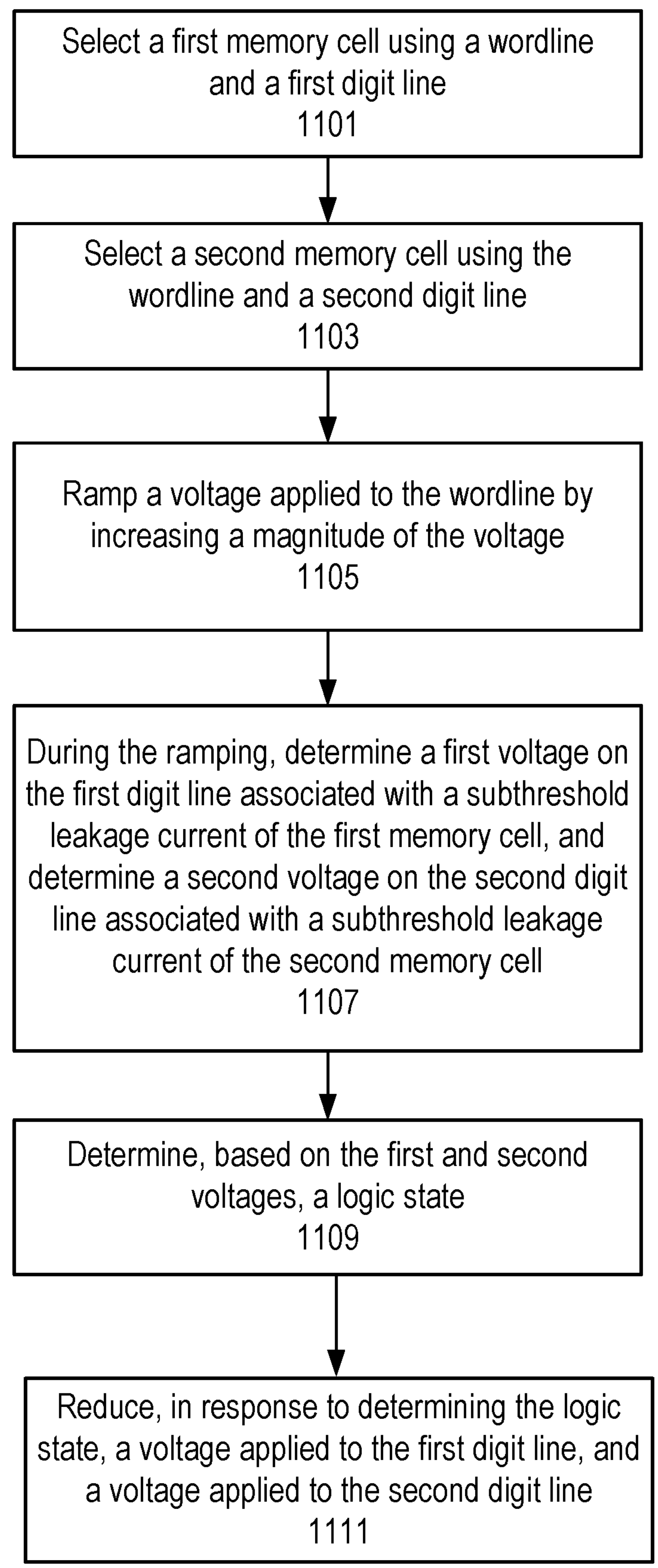
FIG. 11 shows a method for differential subthreshold reading of a memory cell pair in a memory device, in accordance with some embodiments.

FIG. 11 shows a method for differential subthreshold reading of a memory cell pair in a memory device, in accordance with some embodiments. For example, the method of FIG. 11 can be implemented in the system of FIG. 1, 2, or 10.

The method of FIG. 11 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 11 is performed at least in part by one or more processing devices (e.g., controller 120 of FIG. 1).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 1101, a first memory cell is selected using a wordline and a first digit line. In one example, memory cell 1 of FIG. 2 is selected using wordline 202 and digit line 1.

At block 1103, a second memory cell is selected using the wordline and the second digit line. In one example, memory cell 2 is selected using wordline 202 and digit line 2.

At block 1105, a voltage applied to the wordline is ramped by increasing a magnitude of the voltage. In one example, a voltage ramp 306 is applied to the wordline.

At block 1107, during the ramping, a first voltage on the first digit line associated with a subthreshold leakage current of the first memory cell is determined. A second voltage on the second digit line associated with a subthreshold leakage current of the second memory cell is determined. In one example, the first and second voltages are determined based on outputs from sense amplifiers 208, 210.

At block 1109, a logic state of the memory cell pair (e.g., 0 or 1; 01 or 10) is determined based on the first and second voltages. In one example, the logic state is determined based on outputs from detectors 212, 214.

At block 1111, in response to determining the logic state, a voltage applied to the first digit line is reduced, and a voltage applied to the second digit line is reduced. In one example, reducing the voltages applied to the first and second digit lines avoids switching either of the memory cells in the memory cell pair. In one example, the voltages applied to the digit lines are reduced using transistors 204, 206. In one example, the voltages applied to the digit lines are reduced using feedback circuit 1020.

In one embodiment, an apparatus comprises: a memory array (e.g., 102) having a first memory cell and a second memory cell, wherein the first memory cell is configured for selection using a wordline (e.g., 202) and a first digit line, and the second memory cell is configured for selection using the wordline and a second digit line; a first detector (e.g., 212) coupled to the first memory cell, the first detector configured to output a first logic state; a second detector (e.g., 214) coupled to the second memory cell, the second detector configured to output a second logic state; and a feedback circuit (e.g., logic gate 216 and transistors 204, 206) configured to control, based on the first and second logic states, a voltage on the first digit line, and a voltage on the second digit line.

In one embodiment, the feedback circuit comprises a comparator using the first and second logic states as inputs; and the feedback circuit uses an output of the comparator to control the voltages on the first and second digit lines.

In one embodiment, the comparator is a NAND logic gate.

In one embodiment, the feedback circuit controls the voltages on the first and second digit lines to reduce a voltage applied to the first memory cell, and to reduce a voltage applied to the second memory cell.

In one embodiment, the first and second memory cells correspond to storage of a single bit of data by the memory array.

In one embodiment, the first detector is coupled to the first memory cell by the first digit line, and the second detector is coupled to the second memory cell by the second digit line.

In one embodiment, an input to the first detector corresponds to a subthreshold current of the first memory cell, and an input to the second detector corresponds to a subthreshold current of the second memory cell.

In one embodiment, the feedback circuit comprises a first transistor and a second transistor; a current terminal of the first transistor is coupled to the first digit line; a current terminal of the second transistor is coupled to the second digit line; and an output of the feedback circuit is coupled to a gate terminal of the first transistor and a gate terminal of the second transistor.

In one embodiment, the apparatus further comprises a first sense amplifier (e.g., 208) coupled between the first digit line and the first detector, and a second sense amplifier (e.g., 210) coupled between the second digit line and the second detector.

In one embodiment, the apparatus further comprises a latch (e.g., 218), wherein the first and second logic states are inputs to the latch, and an output of the latch corresponds to a bit of data stored in the memory array.

In one embodiment, the latch is configured to latch the first and second logic states in response to an output of the feedback circuit.

In one embodiment, the feedback circuit comprises a logic gate (e.g., 216) having the first and second logic states as inputs, and the output of the feedback circuit is an output of the logic gate.

In one embodiment, the apparatus further comprises: a first logic gate (e.g., 216) having the first and second logic states as inputs, the first logic gate having a first output; and a second logic gate (e.g., 220) having a plurality of inputs, wherein the first output of the first logic gate is a first input to the second logic gate determined by reading the first and second memory cells as a first memory cell pair, and the second logic gate has other inputs determined by reading other memory cell pairs in the memory array, each of the first and other memory cell pairs corresponding to a respective bit stored in the memory array.

In one embodiment, the apparatus further comprises a controller (e.g., 120), wherein: each of the plurality of inputs to the second logic gate corresponds to a respective bit in a codeword read from the memory array by the controller; and an output of the second logic gate signals to the controller that all bits of the codeword have been read.

In one embodiment, an apparatus comprises: a memory array having a first memory cell and a second memory cell, wherein the first memory cell is configured for selection using a wordline and a first digit line, and the second memory is configured for selection using the wordline and a second digit line; a first sense amplifier coupled to the first memory cell, wherein an output of the first sense amplifier corresponds to a leakage current of the first memory cell; a second sense amplifier coupled to the second memory cell, wherein an output of the second sense amplifier corresponds to a leakage current of the second memory cell; a logic gate having first and second logic states as inputs, wherein the first and second logic states are determined based on the outputs of the first and second sense amplifiers; and a controller configured to: bias the wordline by increasing a magnitude of a voltage applied to the wordline, wherein increasing the magnitude moves the applied voltage closer to threshold voltages of the first and second memory cells; and control voltages applied to the first and second digit lines based on an output of the logic gate.

In one embodiment, the apparatus further comprises first and second inverter detectors coupled respectively between the first and second sense amplifiers and the logic gate, wherein the inputs to the logic gate are respective outputs of the first and second inverter detectors.

In one embodiment, each respective inverter detector comprises: a first n-type device and a first p-type device coupled between a first voltage source and the output of the respective inverter detector; and a second n-type device and a second p-type device coupled between a second voltage source and the output of the respective inverter detector; wherein the first voltage source is more positive than the second voltage source.

In one embodiment, the first and second logic states correspond to a difference in leakage currents between the first and second memory cells.

In one embodiment, the controller is further configured to determine, based on the first and second logic states, a value of a logical bit stored in the memory array using the first and second memory cells.

In one embodiment, the voltage applied to the wordline has a first polarity, and the voltages applied to the first and second digit lines each have a second polarity opposite to the first polarity.

In one embodiment, controlling the voltages applied to the first and second digit lines comprises reducing a magnitude of each voltage to avoid either of the first or second memory cells reaching a threshold state.

In one embodiment, the first and second logic states are determined without either of the first or second memory cells thresholding.

In one embodiment, an apparatus comprises: a first memory cell and a second memory cell, wherein the first memory cell is configured for selection using a wordline and a first digit line, and the second memory cell is configured for selection using the wordline and a second digit line; a detector (e.g., 1016) having the first and second digit lines as inputs, and an output (e.g., 1008) determined based on a difference in leakage currents of the first and second memory cells; a controller configured to bias the wordline by increasing a magnitude of a voltage applied to the wordline, wherein increasing the magnitude increases the leakage currents of the first and second memory cells; and a feedback circuit (e.g., 1020) configured to reduce a magnitude of voltages applied to the first and second digit lines based on the output of the detector.

In one example, the first and second digit lines are coupled as inputs to detector 1016 using sense amplifiers 1012, 1014.

In one embodiment, the detector (e.g., inverter detector of FIG. 9) comprises: a first n-type device and a first p-type device coupled between a first voltage source and the output of the detector; and a second n-type device and a second p-type device coupled between a second voltage source and the output of the detector; wherein the first voltage source is more positive than the second voltage source.

In one embodiment, the first digit line (e.g., Digit Line 1 input of inverter detector of FIG. 9) is coupled to a gate of the first p-type device and to a gate of the second n-type device; and the second digit line (e.g., Digit Line 2 input of inverter detector of FIG. 9) is coupled to a gate of the first n-type device and to a gate of the second p-type device.

In one embodiment, the controller is further configured to use the output of the detector to determine a value for a logical bit stored by the first and second memory cells.

In one embodiment, a method comprises: selecting a first memory cell using a wordline and a first digit line; selecting a second memory cell using the wordline and a second digit line; ramping a voltage applied to the wordline, the ramping comprising increasing a magnitude of the voltage; during the ramping, determining a first voltage on the first digit line associated with a subthreshold leakage current of the first memory cell, and determining a second voltage on the second digit line associated with a subthreshold leakage current of the second memory cell; determining, based on the first and second voltages, a logic state; and reducing, in response to determining the logic state, a voltage applied to the first digit line, and a voltage applied to the second digit line.

In one embodiment, the wordline extends in one of a plurality of horizontal planes of wordlines stacked vertically above a semiconductor substrate; the first and second digit lines respectively comprise first and second pillars, each pillar extending vertically away from the semiconductor substrate; the first and second memory cells are respectively located on sides of the first and second pillars.

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, “coupled to” or “coupled with” generally refers to a connection between components, which can be an indirect communicative connection or direct communicative connection (e.g., without intervening components), whether wired or wireless, including connections such as electrical, optical, magnetic, etc.

Reference in this specification to “one embodiment” or “an embodiment” means that a particular feature, structure, or characteristic described in connection with the embodiment is included in at least one embodiment of the disclosure. The appearances of the phrase “in one embodiment” in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple iPhone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. An apparatus comprising:

a first detector coupled to a first memory cell, the first detector configured to output a first logic state;

a second detector coupled to a second memory cell, the second detector configured to output a second logic state; and a feedback circuit configured to control, based on the first and second logic states, a voltage on a first digit line, and a voltage on a second digit line.

2. The apparatus of claim 1, wherein:

the feedback circuit comprises a comparator using the first and second logic states as inputs; and the feedback circuit uses an output of the comparator to control the voltages on the first and second digit lines.

3. The apparatus of claim 2, wherein the comparator is a NAND logic gate.

4. The apparatus of claim 1, wherein the feedback circuit controls the voltages on the first and second digit lines to reduce a voltage applied to the first memory cell, and to reduce a voltage applied to the second memory cell.

5. The apparatus of claim 1, wherein the first and second memory cells correspond to storage of a single bit of data by a memory array.

6. The apparatus of claim 1, wherein the first detector is coupled to the first memory cell by the first digit line, and the second detector is coupled to the second memory cell by the second digit line.

7. The apparatus of claim 1, wherein an input to the first detector corresponds to a subthreshold current of the first memory cell, and an input to the second detector corresponds to a subthreshold current of the second memory cell.

8. The apparatus of claim 1, wherein:

the feedback circuit comprises a first transistor and a second transistor;

a current terminal of the first transistor is coupled to the first digit line;

a current terminal of the second transistor is coupled to the second digit line; and an output of the feedback circuit is coupled to a gate terminal of the first transistor and a gate terminal of the second transistor.

9. The apparatus of claim 1, further comprising a first sense amplifier coupled between the first digit line and the first detector, and a second sense amplifier coupled between the second digit line and the second detector.

10. The apparatus of claim 1, further comprising a latch, wherein the first and second logic states are inputs to the latch, and an output of the latch corresponds to a bit of data stored in a memory array.

11. The apparatus of claim 10, wherein the latch is configured to latch the first and second logic states in response to an output of the feedback circuit.

12. The apparatus of claim 11, wherein the feedback circuit comprises a logic gate having the first and second logic states as inputs, and the output of the feedback circuit is an output of the logic gate.

13. The apparatus of claim 1, further comprising:

a first logic gate having the first and second logic states as inputs, the first logic gate having a first output; and a second logic gate having a plurality of inputs, wherein the first output of the first logic gate is a first input to the second logic gate determined by reading the first and second memory cells as a first memory cell pair, and the second logic gate has other inputs determined by reading other memory cell pairs in a memory array, each of the first and other memory cell pairs corresponding to a respective bit stored in the memory array.

14. The apparatus of claim 13, further comprising a controller, wherein:

each of the plurality of inputs to the second logic gate corresponds to a respective bit in a codeword read from the memory array by the controller; and an output of the second logic gate signals to the controller that all bits of the codeword have been read.

15. A method comprising:

outputting a first logic state;

outputting a second logic state; and controlling, by a feedback circuit based on the first and second logic states, a voltage on a first digit line, and a voltage on a second digit line;

wherein controlling the voltages on the first and second digit lines reduces a voltage.

16. The method of claim 15, wherein controlling the voltages on the first and second digit lines reduces a voltage applied to a first memory cell, and reduces a voltage applied to a second memory cell.

17. The method of claim 16, wherein the first and second memory cells correspond to storage of a single bit of data by a memory array.

18. The method of claim 15, wherein the first and second logic states are inputs to a latch, and an output of the latch corresponds to a bit of data stored in a memory array.

19. The method of claim 18, wherein the latch is configured to latch the first and second logic states in response to an output of a feedback circuit.

20. The method of claim 19, wherein the feedback circuit comprises a logic gate having the first and second logic states as inputs, and the output of the feedback circuit is an output of the logic gate.

* * * * *